United States Patent
Xiao et al.

(10) Patent No.: US 7,049,052 B2
(45) Date of Patent: May 23, 2006

(54) METHOD PROVIDING AN IMPROVED BI-LAYER PHOTORESIST PATTERN

(75) Inventors: Hanzhong Xiao, Pleasanton, CA (US); Helen H. Zhu, Fremont, CA (US); Kuo-Lung Tang, Hsin-Chu (TW); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 256 days.

(21) Appl. No.: 10/435,130

(22) Filed: May 9, 2003

(65) Prior Publication Data

US 2004/0224264 A1    Nov. 11, 2004

(51) Int. Cl.
*G03F 7/00* (2006.01)
*G03F 7/36* (2006.01)

(52) U.S. Cl. ............... 430/323; 430/313; 430/316; 430/317; 430/322; 216/41; 216/72; 216/79

(58) Field of Classification Search ............... 430/313, 430/316, 317, 322, 323; 216/51, 72, 79
See application file for complete search history.

(56) References Cited

U.S. PATENT DOCUMENTS

| | | | |
|---|---|---|---|
| 5,277,749 A | 1/1994 | Griffith et al. | 156/643 |
| 5,399,462 A | 3/1995 | Sachdev et al. | 430/323 |
| 5,726,102 A * | 3/1998 | Lo | 438/718 |
| 5,985,524 A | 11/1999 | Allen et al. | 430/326 |
| 6,541,361 B1 * | 4/2003 | Ko et al. | 438/585 |
| 6,551,938 B1 * | 4/2003 | Wu et al. | 438/700 |
| 2001/0004510 A1 | 6/2001 | Wheeler | 430/270.1 |
| 2001/0031420 A1 | 10/2001 | Lee et al. | 430/270.1 |
| 2002/0066535 A1 | 6/2002 | Brown et al. | 156/345.29 |
| 2003/0036021 A1 | 2/2003 | Khan et al. | 430/313 |
| 2003/0219683 A1 | 11/2003 | Nagarajan et al. | 430/296 |

FOREIGN PATENT DOCUMENTS

| | | |
|---|---|---|
| DE | 19504434 C | 5/1996 |
| DE | 19919036 C | 1/2001 |
| EP | 1324374 A2 | 7/2003 |
| JP | 02172223 | 3/1990 |
| WO | WO91/09646 | 7/1991 |
| WO | WO99/21217 | 4/1999 |

OTHER PUBLICATIONS

RD 322110, "Reducing etch rate of photoresist during reactive ion etching—using polymer enhance agent to form vertical etched profiles", Jan. 1991.*
International Search Report, dated Nov. 29, 2004.

* cited by examiner

*Primary Examiner*—Nicole Barreca
(74) *Attorney, Agent, or Firm*—Beyer Weaver & Thomas LLP (57) ABSTRACT

A method for etching a feature in a layer is provided. An underlayer of a polymer material is formed over the layer. A top image layer is formed over the underlayer. The top image layer is exposed to patterned radiation. A pattern is developed in the top image layer. The pattern is transferred from the top image layer to the underlayer with a reducing dry etch. The layer is etched through the underlayer, where the top image layer is completely removed and the underlayer is used as a pattern mask during the etching the layer to transfer the pattern from the underlayer to the layer.

15 Claims, 9 Drawing Sheets

METHOD PROVIDING AN IMPROVED BI-LAYER PHOTORESIST PATTERN

BACKGROUND OF THE INVENTION

1. Field of the Invention

The invention relates to a method providing improved bi-layer photoresist patterning.

2. Description of the Related Art

There is a desire in the industry to achieve higher circuit density. On method of achieving higher density is to provide improved resolution of circuit patterns in resist fields. On technique for doing this is by using bi-layer photoresist methods. Bi-layer photoresist methods are described in U.S. Pat. No. 5,985,524, issued Nov. 16, 1999 to Allen et al., entitled, "Process For Using Bilayer Photoresist;" and in U.S. Pat. No. 5,399,462, issued Mar. 21, 1995 to Sachev et al., entitled, "Method of Forming Sub-Half Micron Patterns With Optical Lithography Using Bilayer Resist Compositions Comprising A Photosensitive Polysilsesquioxane;" and U.S. patent application Publication 2001/0031420A1, published Oct. 18, 2001 to Lee et al., entitled "Partially Crosslinked Polymer For Bilayer Photoresist;" and U.S. patent application Publication 2001/0004510A1, published Jun. 21, 2001 to Wheeler., entitled "Refractory Bilayer Resist Materials For Lithography Using Highly Attenuated Radiation," which are all incorporated by reference for all purposes discuss bi-layer photoresist methods that use an oxygen reactive ion etch (RIE) to etch an underlayer.

Figure 1:
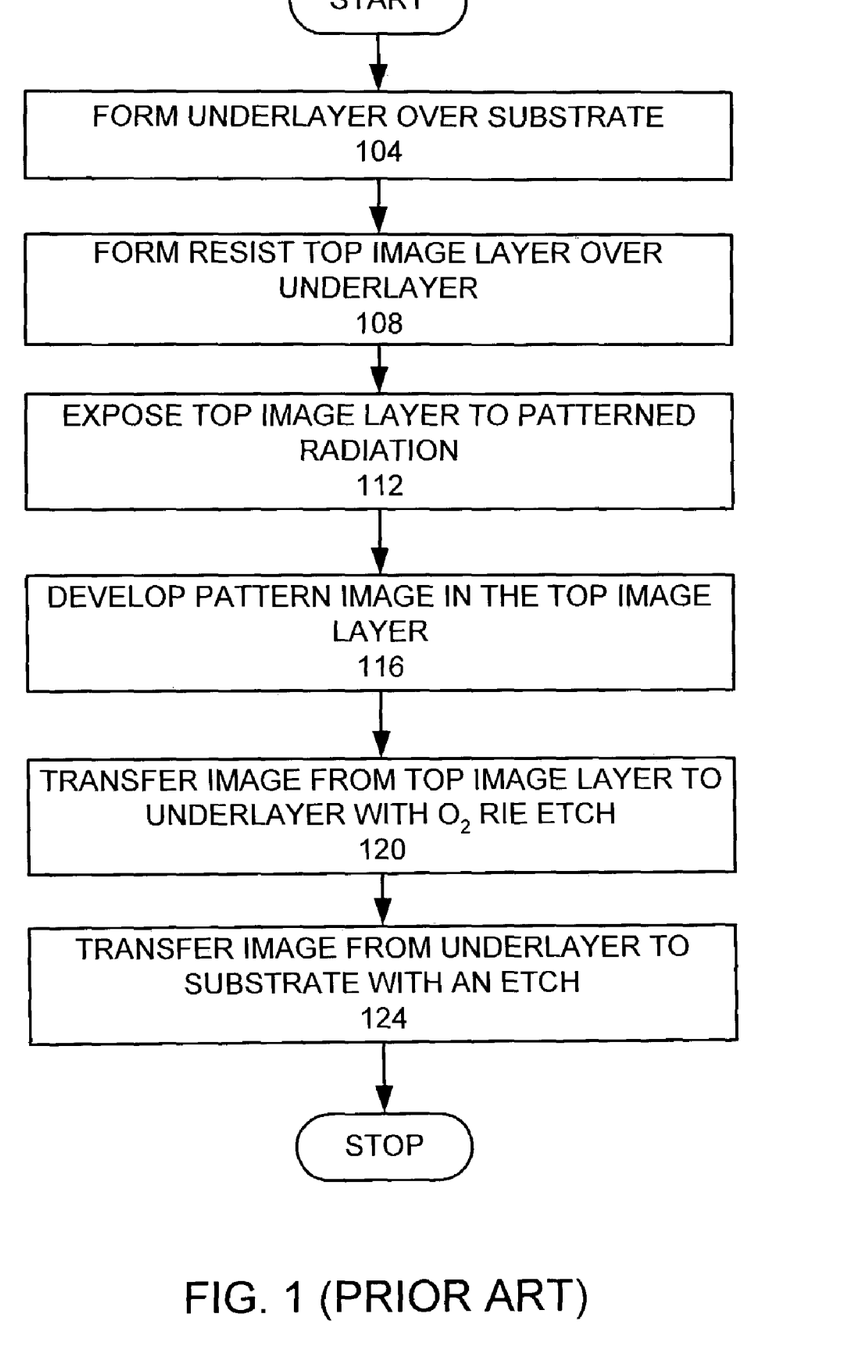
FIG. 1 is a flow chart of a bi-layer photoresist process used in the prior art.
Figure 2A:
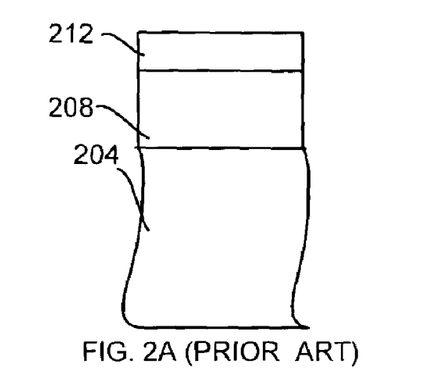
FIGS. 2A–E are cross-sectional views of a substrate during the process as shown in FIG. 1.

To facilitate understanding, FIG. 1 is a flow chart of a bi-layer photoresist process. First, an underlayer may be formed over a substrate (step 104). FIG. 2A shows a substrate, formed by a wafer 204 and a layer to be etched 208. An underlayer 212 may be formed over the layer to be etched 208. The layer to be etched 208 may be part of the wafer 204 or there may be one or more layers between the wafer 204 and the layer to be etched 208. The substrate may be the layer to be etched 208 or the wafer 204 or both.

Figure 2B:
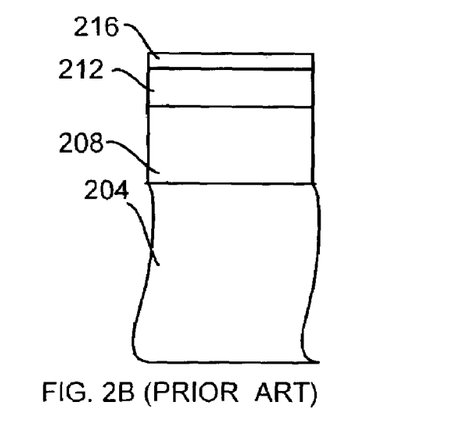
Figures 2C, 2D:
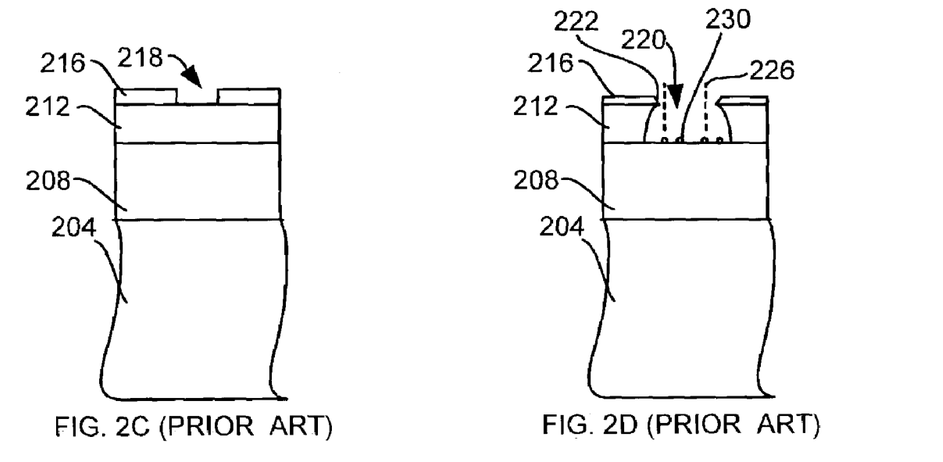

A resist top image layer may be formed over the underlayer (step 108). FIG. 2B shows a resist top image layer 216 formed over the underlayer 212. The top image layer 216 may be exposed to patterned radiation (step 112). The pattern may then be developed in the top image layer (step 116). FIG. 2C shows a hole 218 that has been developed in the top image layer 216 as a result of the patterned radiation. The image may be transferred from the top image layer 216 to the underlayer 212 using an oxygen reactive ion etch (step 120). FIG. 2D shows a trench 220 that has been etched into the underlayer 212 as a result of the oxygen reactive ion etch. Oxygen RIE uses oxidation to etch, thus providing an oxidation dry etch.

Some of the top image layer 216 has been etched away during the transfer of the image, as shown. To increase the etch selectivity of the underlayer 212 to the top image layer 216 during the oxygen reactive ion etch, silicon is added to the top image layer 216. Even with silicon addition to the top image layer 216, selectivity may not be as high as desired, which may require the top image layer 216 to be thicker than desired or the underlayer 208 to be thinner than desired. In addition, the oxygen reactive ion etch may cause faceting 222 of the top image layer 216, which may enlarge the hole, increasing the critical dimension. In addition, the oxygen reactive ion etch may cause undercutting of the top image layer 216, which also increases the critical dimension. As a result of faceting and erosion, the critical dimension, of the hole at the top surface of the layer to be etched 208 may be much greater than the original trench size shown by dotted lines 226. To ensure that the underlayer is completely etched, the underlayer is normally over etched. The oxygen RIE may provide a large part of the CD enlargement during the over etch, with the least enlargement occurring at the beginning of the etch. In addition, the addition of silicon and the erosion of the top image layer 216 may cause silicon etch residue 230 to form on the surface of the layer to be etched 208, which may cause subsequent micromasking. The silicon may also form on a surface of the underlayer 212 during the etching of the underlayer 212, which may cause micromasking of the underlayer.

Figure 2E:
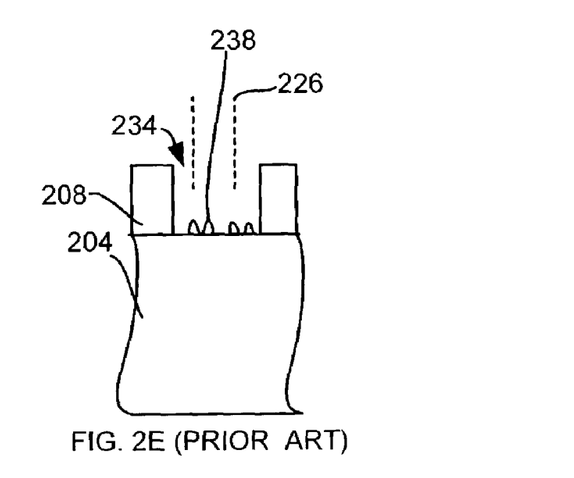

The image is transferred from the underlayer 212 to the substrate by an etch (step 124). FIG. 2E shows the layer to be etched 208 after a hole 234 has been etched. During the etch the top image layer is completely etched away, so that the underlayer acts as a pattern mask during the etch. The critical dimensions of the hole 234 are larger than the original trench size, shown by dotted lines 226. In addition, micromasking has formed bumps 238 at the bottom of the hole.

It would be desirable to provide better critical dimension control and reduce micromasking.

SUMMARY OF THE INVENTION

To achieve the foregoing and in accordance with the purpose of the present invention, a method for etching a feature in a layer is provided. An underlayer of a polymer material is formed over the layer. A top image layer is formed over the underlayer. The top image layer is exposed to patterned radiation. A pattern is developed in the top image layer. The pattern is transferred from the top image layer to the underlayer with a reducing dry etch. The layer is etched through the underlayer, where the top image layer is completely removed and the underlayer is used as a pattern mask during the etching the layer to transfer the pattern from the underlayer to the layer.

In another embodiment of the invention, a method for etching a feature in a layer is provided. An underlayer of a polymer material is formed over the layer. A top image layer is formed over the underlayer. The top image layer is exposed to patterned radiation. A pattern is developed in the top image layer. The top image layer is hardened. The pattern is transferred from the top image layer to the underlayer. The layer is etched through the underlayer, where the top image layer is completely removed and the underlayer is used as a pattern mask during the etching the layer to transfer the pattern from the underlayer to the layer In another embodiment of the invention, an apparatus for etching a feature in a layer on a substrate is provided. A process chamber, within which the substrate may be placed, is provided. A gas source, which is able to provide different gas chemistries to the process chamber, is provided. An ionizing power source for generating a plasma from the gas chemistries is provided. A controller is controllably connected to the gas source and ionizing power source, wherein the controller comprises computer readable media where the computer readable media comprises computer instructions for providing a reducing gas, computer instructions for energizing the reducing gas to create a plasma for etching an underlayer, computer instructions for terminating the etching of the underlayer, computer instructions for providing a layer etchant; and computer instructions for energizing the layer etchant to create a plasma for etching the layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 3:
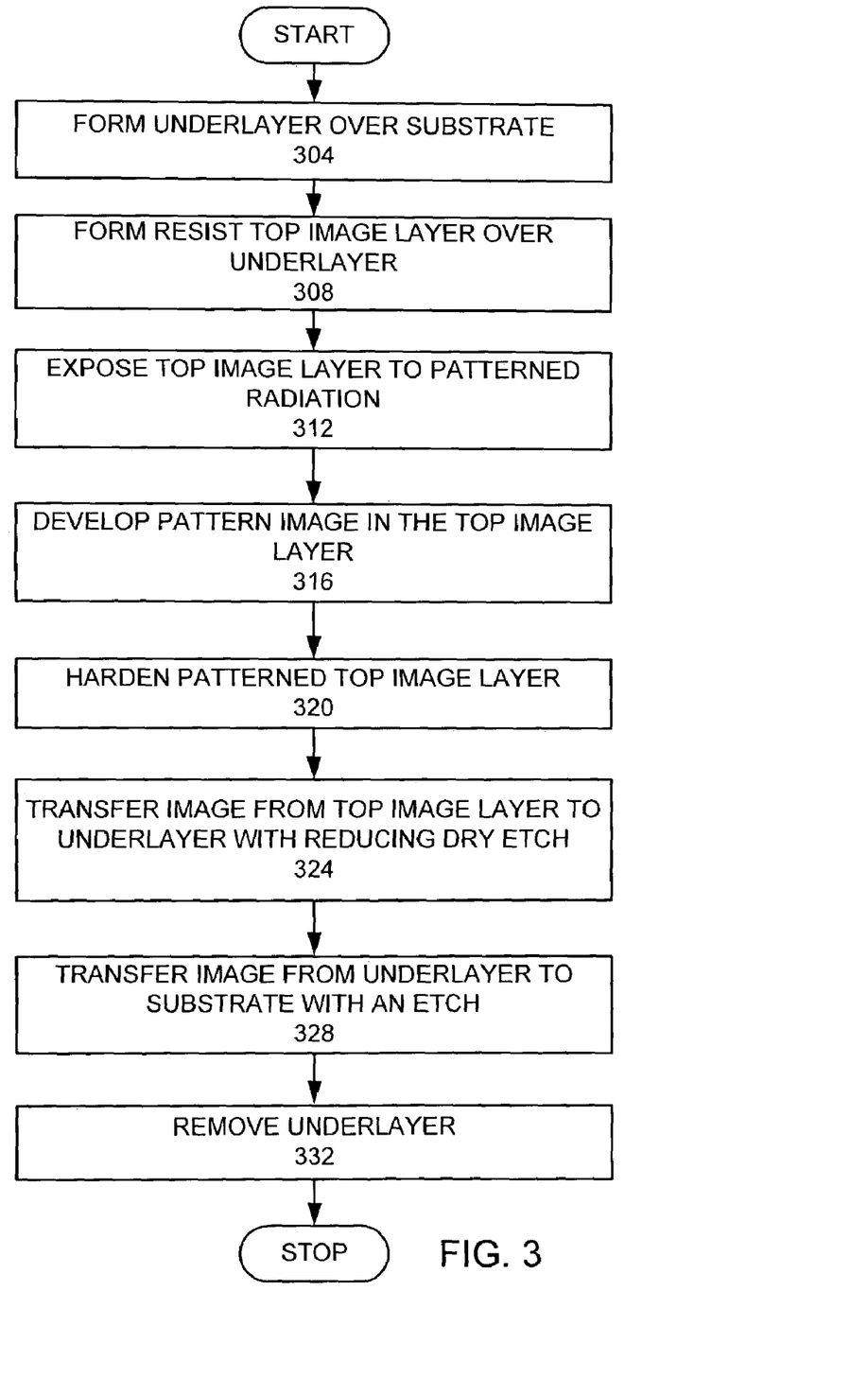
FIG. 3 is a flow chart of a bi-layer photoresist inventive process.
Figure 4A:
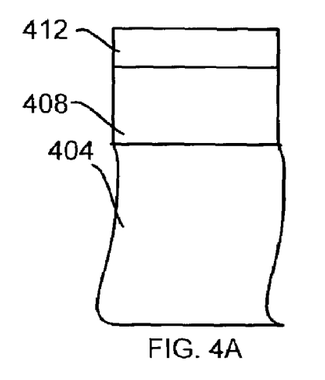
FIGS. 4A–F are cross-sectional views of a substrate during the process as shown in FIG. 3.

FIG. 3 is a flow chart of a bi-layer photoresist inventive process. First, an underlayer is formed over a substrate (step 304). FIG. 4A shows a substrate, formed by a wafer 404 and a layer to be etched 408. An underlayer 412 is formed over the layer to be etched 408. The layer to be etched 408 may be part of the wafer 404 or there may be one or more layers between the wafer 404 and the layer to be etched 408. The substrate may be the layer to be etched 408 or the wafer 404 or both. The underlayer 412 preferably has a thickness of between about 0.2–2 microns. More preferably, the underlayer 412 has a thickness of about one micron.

Figure 4B:
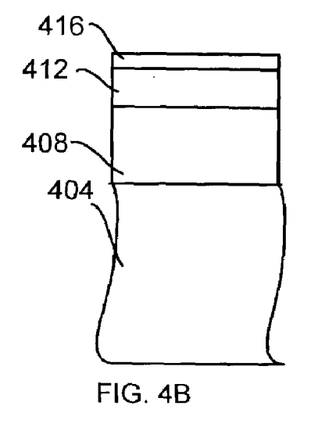

A resist top image layer is formed over the underlayer (step 408). FIG. 4B shows a resist top image layer 416 formed over the underlayer 412. The top image layer 416 may be formed from either an I-line, deep ultra-violet (DUV), or 193 nm or lower generation resist material. Preferably, the resist top image layer 416 has a thickness between about 0.1 to 0.3 microns. The copolymer of 2-methyl-2-adamantyl-methacrylate with mevalonic lactone methacrylate (poly(MAdMA-co-MLMA)), is an example of a class of photoresist materials based upon derivatives of poly(methyl methacrylate) PMMA, which may be used as chemically amplified 193 nm positive resist when combined with an appropriate photoacid generator.

The underlayer 412 is formed from a polymer material. Preferably, the polymer material is a photoresist material or a BARC material. If the underlayer is a photoresist material, preferably the underlayer 412 is made from a different photoresist material than the top image layer 416. For example, the top image layer 416 may be a deep UV material and the underlayer 412 may be an I-line material. The difference of materials allows the top image layer 416 to be imaged, in this example with DUV radiation, without changing the underlayer. The underlayer should also be a material that allows a selective etching of the layer, so that the underlayer 412 may be used as a mask while etching the layer 408.

Preferably, the top image layer 416 has a higher concentration of silicon than the underlayer 412 to increase subsequent etch selectivity. More preferably, the top image layer 416 is silicon containing, while the underlayer 412 is substantially silicon free, to increase selectivity for etching the underlayer 412 while using the top image layer 412 as a mask. Both the underlayer 412 and the top image layer 416 may be applied as spin on or spray coatings.

Figure 4C:
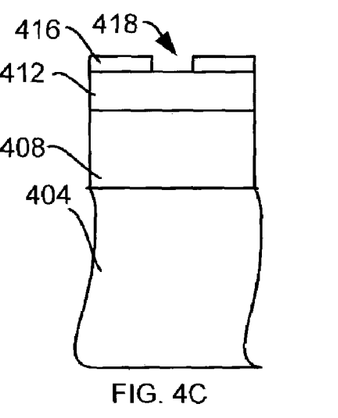

The top image layer 416 is exposed to patterned radiation (step 312). The pattern is then developed in the top image layer (step 316). FIG. 4C shows a hole 418 that has been developed in the top image layer 416 as a result of the patterned radiation.

Figure 6:
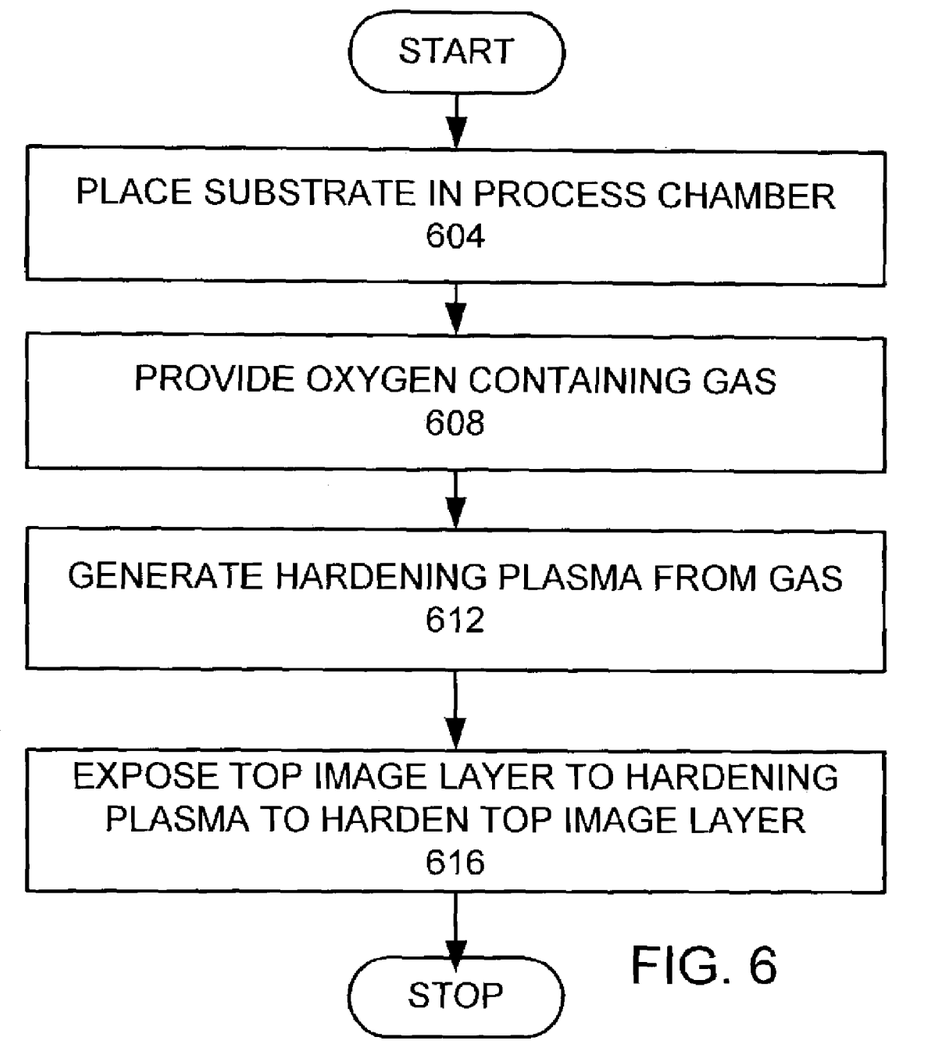
FIG. 6 is a more detailed flow chart of a hardening step.

The patterned top image layer 416 is then hardened (step 320). FIG. 6 is a more detailed flow chart of the hardening step. The substrate is placed in a process chamber (step 604).

Figure 5:
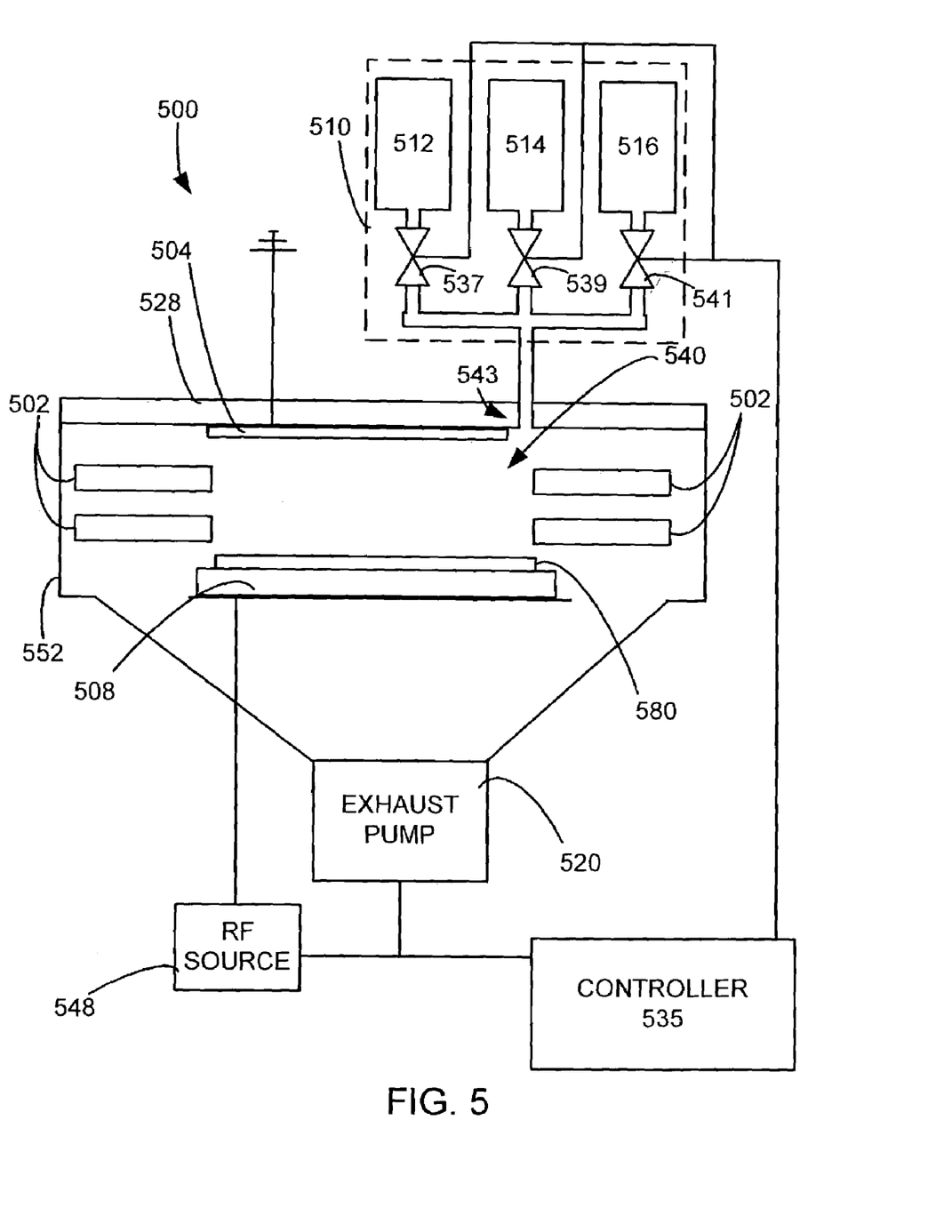
FIG. 5 is a schematic view of a process chamber that may be used in a preferred embodiment of the invention.

FIG. 5 is a schematic view of a process chamber 500 that may be used in the preferred embodiment of the invention. In this embodiment, the plasma processing chamber 500 comprises confinement rings 502, an upper electrode 504, a lower electrode 508, a gas source 510, and an exhaust pump 520. The gas source 510 comprises a first gas source 512, a second gas source 514, and a third gas source 516. Other gas sources may be added. Within plasma processing chamber 500, the substrate wafer 580, over which the underlayer and top image layer are deposited, is positioned upon the lower electrode 508. The lower electrode 508 incorporates a suitable substrate chucking mechanism (e.g., electrostatic, mechanical clamping, or the like) for holding the substrate wafer 580. The reactor top 528 incorporates the upper electrode 504 disposed immediately opposite the lower electrode 508. The upper electrode 504, lower electrode 508, and confinement rings 502 define the confined plasma volume 540. Gas is supplied to the confined plasma volume by gas source 510 through a gas inlet 543 and is exhausted from the confined plasma volume through the confinement rings 502 and an exhaust port by the exhaust pump 520. The exhaust pump 520 forms a gas outlet for the plasma processing chamber. An RF source 548 is electrically connected to the lower electrode 508, while the upper electrode 504 is grounded. Chamber walls 552 define a plasma enclosure in which the confinement rings 502, the upper electrode 504, and the lower electrode 508 are disposed. The RF source 548 may comprise a 27 MHz power source and a 2 MHz power source. Different combinations of connecting RF power to the electrodes are possible.

The process chamber 500 may be a 2300 Exelan™ dielectric etch system made by Lam Research Corporation™ of Fremont, Calif. A controller 535 is controllably connected to the RF source 548, the exhaust pump 520, a first control valve 537 connected to the first gas source 512, a second control valve 539 connected to the second gas source 514, and a third control valve 541 connected to the third gas source 516. A showerhead may be connected to the gas inlet 543. The gas inlet 543 may be a single inlet for each gas source or a different inlet for each gas source or a plurality of inlets for each gas source or other possible combinations.

A hardening gas, comprising oxygen is provided into the process chamber 500 (step 608). The first gas source 512 may be used to provide the hardening gas or the oxygen component of the hardening gas. A plasma is generated from the hardening gas (step 612). Generally, this is performed by energizing the hardening gas to create a plasma, with little biasing. Generally, by providing low or no power from the low frequency power source, the bias is kept low. This may be done by providing less than 500 Watts of power to the low frequency power source. More preferably, this is done by providing no power to the low frequency power source. Sufficient power is provided to the high frequency power source to generate and maintain a plasma.

The top image layer 416 is exposed to the oxygen-containing plasma to harden the top image layer (step 616). Since the plasma contains oxygen ions with little bias energies, the oxygen ions combine with the silicon in the image top layer 416 to form silicon oxide, which is more etch resistant. Since the underlayer preferably does not have silicon, the oxygen ions do not form silicon oxide in the underlayer 412. An example of an oxygen plasma may use a gas of between 20–200 sccm $O_2$ to form the silicon oxide. In addition, the gas may further comprise 0–1,000 sccm argon and 0–1,000 sccm nitrogen, which may be used as diluents. The plasma may be generated at a pressure of 10–500 mTorr at a temperature range of about −20° to 60° C. with a high frequency RF power of 100–1,000 Watts. Preferably, a low frequency RF power of less than 500 Watts is provided to provide insufficient bias for causing sputtering. More preferably, the low frequency RF power is about 0 Watts.

By providing a flow rate of oxygen greater than 20 sccm and by providing a ratio of the flow of oxygen to total flow of the gas of greater than 4%, the hardening gas may sufficiently harden the top image layer 416. More preferably, the ratio of oxygen to total flow of the gas is greater than 8%.

The duration of the hardening process is kept sufficiently short so that less than 25% of the thickness of the underlayer 412 is etched during the hardening process. Minimizing the etch of the underlayer 412 during the hardening process is desirable, since as discussed above, the presence of oxygen during an etch causes bowing and CD enlargement. Since much of the enlargement occurs during the end part of an over etch, etching less than 25% of the underlayer minimizes bowing and CD enlargement.

Figure 7:
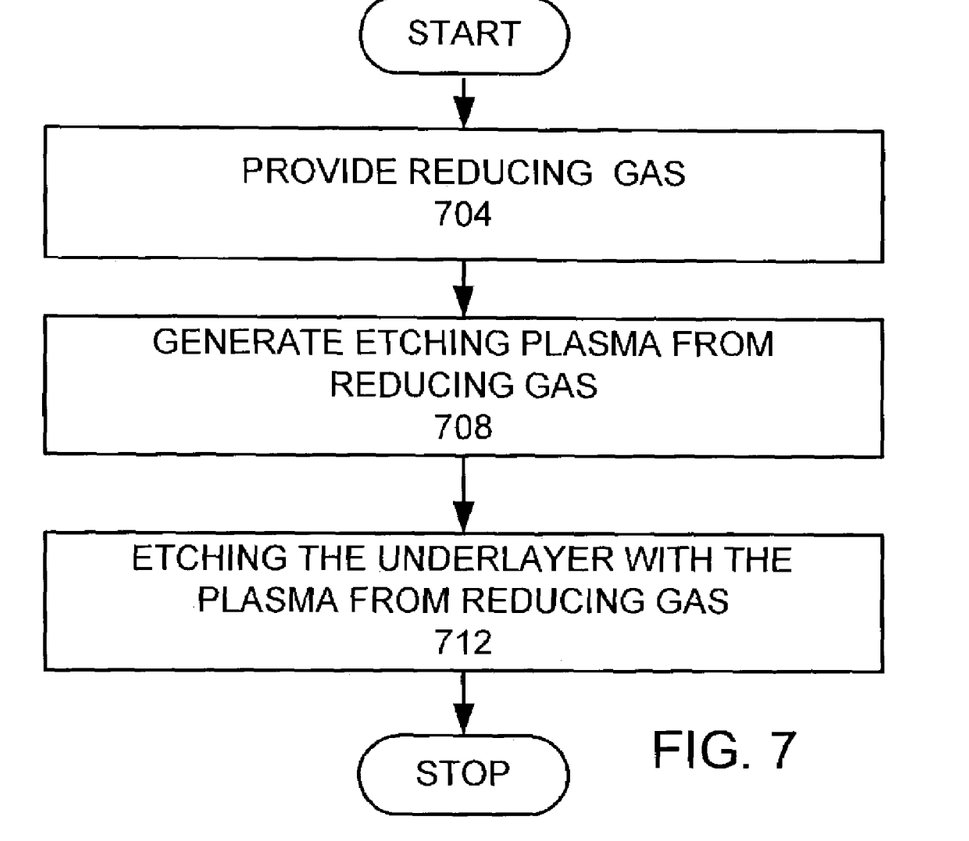
FIG. 7 is a more detailed flow chart of a reducing reactive ion etch.

The image is then transferred from the top image layer 416 to the underlayer 412 using a reducing reactive ion etch (step 324) to etch through the remaining greater than 75% of the underlayer. This step may occur in the same process chamber as the previous step or in a different process chamber. Providing this step in the same process chamber as the previous step, may increase throughput speed by eliminating transfer time. FIG. 7 is a more detailed flow chart of the reducing reactive ion etch. A reducing gas is provided to the process chamber (step 704). A reducing gas is a gas that causes chemical reducing instead of oxidation. Examples of reducing gasses would be a gas with nitrogen and hydrogen components, such as an $N_2$ and $H_2$ gas or a gas of $NH_3$. The reducing gas may comprise additional additives. An inert diluent such as argon may be added. A hydrocarbon may be added, to help form sidewalls to help to form straighter walls, further reducing critical dimension enlargement. A hydrofluorocarbon may also be added to provide a small amount of fluorine to remove silicon residue to reduce micromasking and to provide additional hydrocarbon to reduce enlargement that may be caused by too much fluorine. Preferably, to provide reducing instead of oxidation, the reducing gas is free from any significant amount of oxygen. More preferably, the reducing gas is oxygen free. An example of a reducing gas would comprise 50–1,000 sccm of $N_2$, 50–1,000 sccm of $H_2$, 0–100 sccm of a hydrocarbon ($C_xH_y$), 0–20 sccm of $CH_xF_y$, (preferably $CH_3F$) and an argon diluent. More preferably, the reducing gas would comprise 100–500 sccm of $N_2$, 100–500 sccm of $H_2$, 10–50 sccm of a hydrocarbon ($C_xH_y$), 1–5 sccm of $CH_xF_y$, and an argon diluent. Generally, the hydrogen species provides the reducing, while the nitrogen provides bombardment for etching. The nitrogen may also be used to protect the sidewall to reduce enlargement and bowing.

An etching plasma is generated from the reducing gas (step 708). This may be done by providing a high frequency RF at a power of between about 100 to 1,000 Watts and a low frequency RF at a power of between about 100 to 1,000 Watts. The high frequency RF is used to energize the reducing gas to create a plasma. The low frequency RF is used to accelerate the plasma to the substrate with sufficient energy to cause etching. In addition, a pressure in the range of about 10 to 500 mTorr is maintained, with a temperature of about −20° to about 60° C. Other environmental parameters may be used, however sufficient energy is needed to create the plasma and accelerate the plasma to the substrate to cause etching.

Figure 4D:
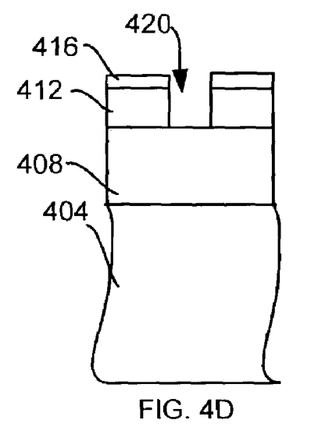

The underlayer is etched with the plasma from the reducing gas to transfer the pattern from the top image layer to the underlayer (step 712). The nitrogen and hydrogen provide a reducing RIE using a reducing etch, thus providing a reducing dry etch. FIG. 4D shows a trench 420 that has been etched into the underlayer 412 as a result of the reducing reactive ion etch. The hardening of the patterned top image layer 416 causes a reduction in erosion and faceting, so that more of the patterned top image layer 416 remains after etching and faceting is reduced, as shown. In the alternative, the increased selectivity from the hardening may allow a thinner top image layer to be used to provided improved critical dimensions or a thicker underlayer may be provided. In addition, the addition of the hydrofluorocarbon has reduced the silicon residue. The reducing chemistry and hydrocarbon passivation have reduced critical dimension enlargement, as shown.

Figure 4E:
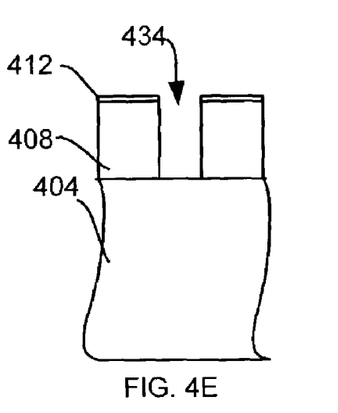

The image is transferred from the underlayer 412 to the substrate by an etch (step 328). This step may occur in the same process chamber as the previous step or in a different process chamber. Providing this step in the same process chamber as the previous step, may increase throughput speed by eliminating transfer time. FIG. 4E shows the layer to be etched 408 after a hole 434 has been etched. The critical dimensions of the hole 434 are closer to the critical dimensions of the original trench size. In addition, the reduction in micromasking results in a flatter bottom of the hole. If the layer to be etched is a dielectric material, the etching chemistry may comprised of CxHyFz, O2, Ar, and N2 in plasma with a relatively high bias. During the transfer of the pattern from the underlayer 412 to the substrate, the top image layer is removed, so that the underlayer is used as a mask for forming an etched pattern in the substrate.

Figure 4F:
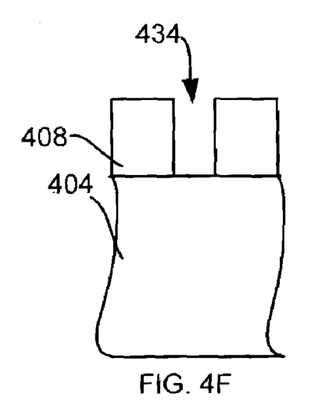

The underlayer is then removed (step 332). FIG. 4F shows the layer 408 after the underlayer has been removed. The hole 434 forms a semiconductor feature, which may be filled with copper to form a contact or may be used for forming some other structure. Since the underlayer is only for transferring the pattern to the layer 408, the underlayer is removed after the etch is completed. Since the underlayer is removed, it is desirable to form the underlayer out of a polymer, which is a soft material, which is easy to remove. Preferably, the underlayer is completely removed.

Other embodiments may provide a reducing etch of the underlayer without the hardening step. Other embodiments may provide a hardening step followed by an etching using an oxidation.

Figure 8A:
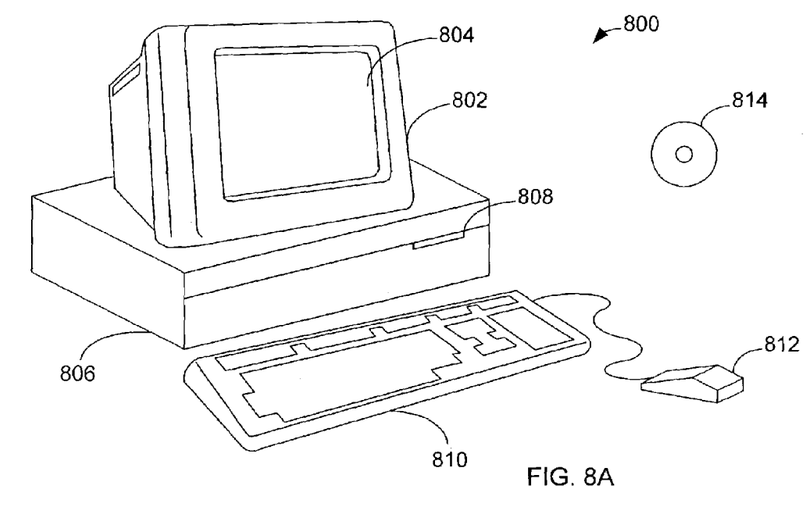
FIGS. 8A and 8B illustrate a computer system, which is suitable for implementing a controller.
Figure 8B:
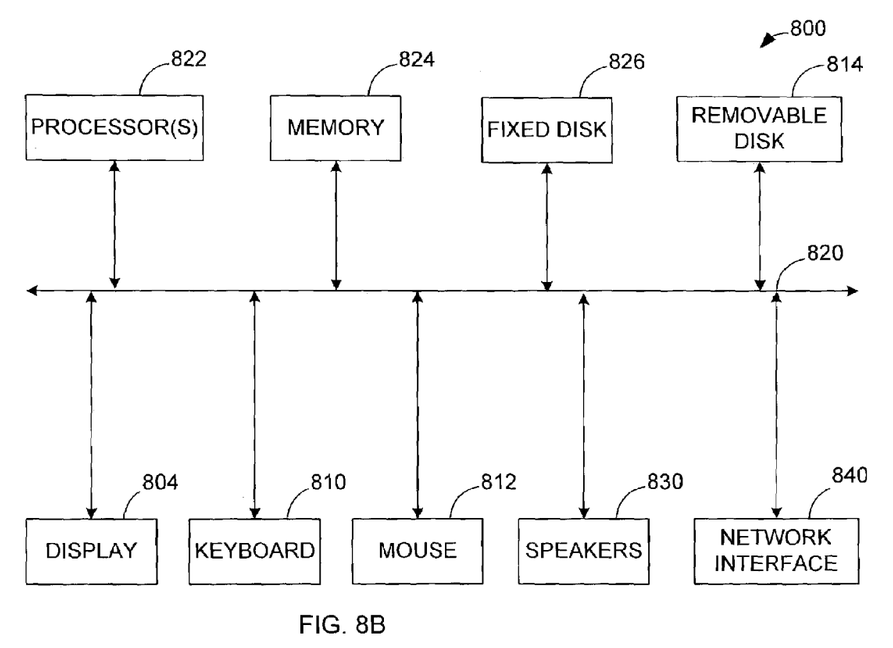

FIGS. 8A and 8B illustrate a computer system 800, which is suitable for implementing a controller 535 used in embodiments of the present invention. FIG. 8A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 8B is an example of a block diagram for computer system 800. Attached to system bus 820 is a wide variety of subsystems. Processor(s) 822 (also referred to as central processing units or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bidirectional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

EXAMPLE

In one example of the invention, a hardening step is preformed using a gas chemistry of 200 sccm Ar, 300 sccm $N_2$ and 50 sccm $O_2$. A 27 MHz RF power source provided 400 Watts of energy, while a 2 MHz RF power source provided no energy. Pressure was maintained at 70 mT, and the temperature was maintained at 20° C.

In the etching of the underlayer, a gas chemistry of 500 sccm $N_2$, 100 sccm $H_2$, and 5 sccm $CH_3F$ is provided. The 27 MHz RF power source provided 200 Watts of energy, while the 2 MHz RF power source provided 200 Watts of power. Pressure was maintained at 70 mT, and temperature was maintained at 20° C.

Figure 9:
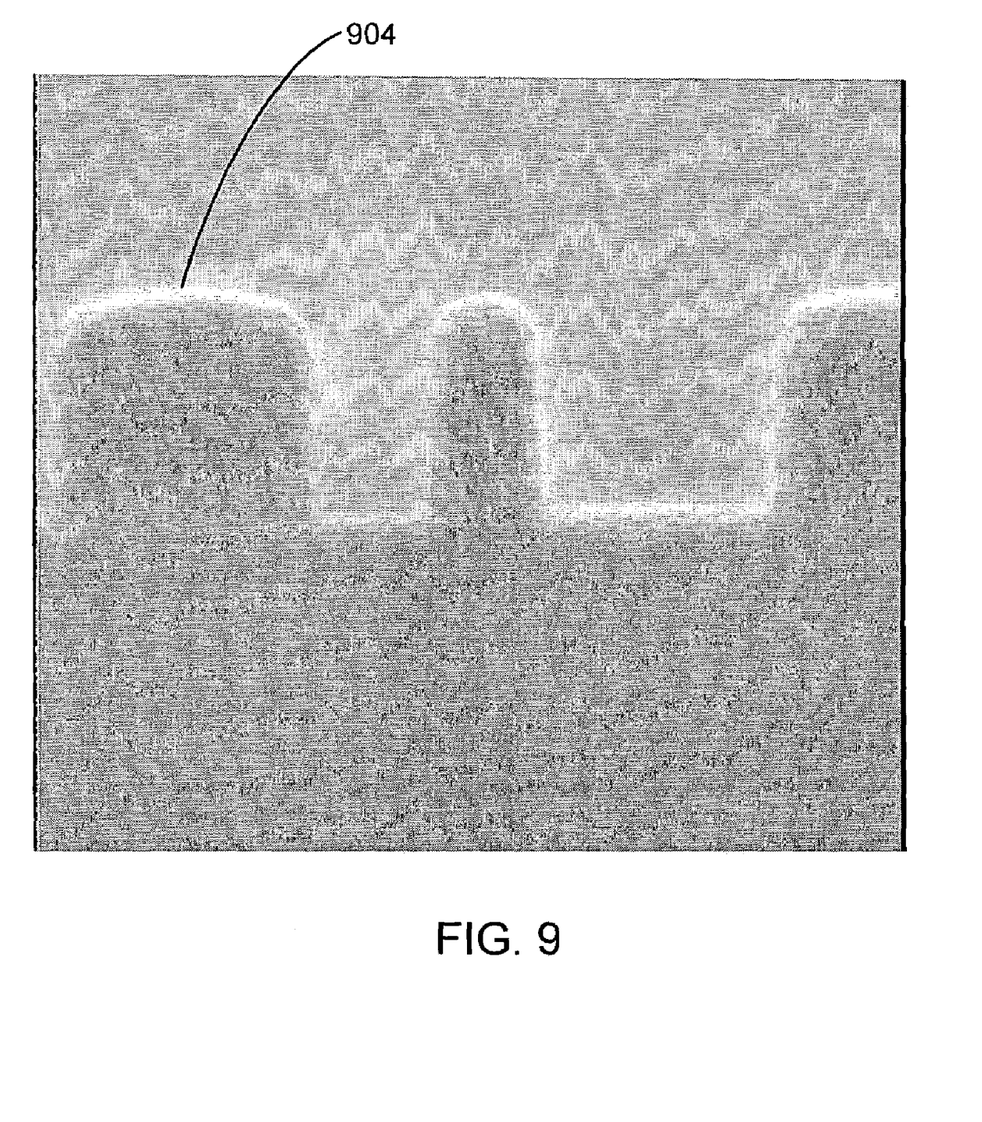
FIG. 9 is a micrograph of a cross-sectional view of an underlayer that has been etched according to an example of the invention.

FIG. 9 is a micrograph of a cross-sectional view of an underlayer that has been etched according to this example. The top of the top image layer 904 is relatively flat with no faceting. Bowing of the sidewalls and CD enlargement is significantly reduced. In addition, the absence of silicon residue should also be noted. It has been found that the hardening by oxidation provides a selectivity of the top image layer to the underlayer may almost double to a selectivity of 1:5.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for etching a feature in a layer, comprising:
    forming an underlayer of a polymer material over the layer;
    forming a top image layer over the underlayer;
    exposing the top image layer to patterned radiation;
    developing a pattern in the top image layer;
    hardening the pattern in the top image layer, wherein hardening the pattern in the top image layer, comprises exposing the top image layer to a oxygen containing plasma and etching less than 25% of the underlayer;
    transferring the pattern from the top image layer to the underlayer with a reducing dry etch; and
    etching the layer through the underlayer, where the top image layer is completely removed and the underlayer is used as a pattern mask during the etching the layer to transfer the pattern from the underlayer to the layer.

2. The method, as recited in claim 1, wherein the transferring the pattern from the top image layer to the underlayer, comprises:
    providing a reducing gas;
    generating a plasma from the reducing gas; and etching the underlayer with the plasma from the reducing gas.

3. The method, as recited in claim 2, wherein the reducing gas is oxygen free.

4. The method, as recited in claim 3, wherein the reducing gas provides a nitrogen species and hydrogen species in the plasma generated from the reducing gas.

5. The method, as recited in claim 4, wherein the reducing gas further comprises a hydrocarbon.

6. The method, as recited in claim 5, wherein the reducing gas further comprises a hydrofluorocarbon.

7. The method, as recited in claim 4, wherein the reducing gas further comprises a hydrofluorocarbon.

8. The method, as recited in claim 1, further comprising removing the underlayer.

9. The method, as recited in claim 1, further comprising removing the underlayer.

10. A method for etching a feature in a layer, comprising:
  forming an underlayer of a polymer material over the layer;
  forming a top image layer over the underlayer;
  exposing the top image layer to patterned radiation;
  developing a pattern in the top image layer;
  hardening the top image layer,
  transferring the pattern from the top image layer to the underlayer, comprising
    providing a reducing gas, which is oxygen free;
    generating a plasma from the oxygen free reducing gas; and
    etching the underlayer with the plasma from the oxygen free reducing gas; and
  etching the layer through the underlayer, where the top image layer is completely removed and the underlayer is used as a pattern mask during the etching the layer to transfer the pattern from the underlayer to the layer.

11. The method, as recited in claim 10, wherein the top image layer has a higher concentration of silicon than the underlayer.

12. The method, as recited in claim 10, wherein the oxygen containing plasma is generated from an oxygen containing gas where a flow of oxygen is more than 4% of total gas flow.

13. The method, as recited in claim 10, wherein the reducing gas provides a nitrogen species and hydrogen species in the plasma generated from the reducing gas.

14. The method, as recited in claim 13, wherein the reducing gas further comprises a hydrocarbon.

15. The method, as recited in claim 14, wherein the reducing gas further comprises a hydrofluorocarbon.

* * * * *